(12) United States Patent
Matsuoka

(10) Patent No.: US 8,873,317 B2
(45) Date of Patent: Oct. 28, 2014

(54) MEMORY DEVICE

(71) Applicant: Kabushiki Kaisha Toshiba, Tokyo (JP)

(72) Inventor: Fumiyoshi Matsuoka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/960,440

(22) Filed: Aug. 6, 2013

(65) Prior Publication Data

US 2014/0269116 A1 Sep. 18, 2014

Related U.S. Application Data

(60) Provisional application No. 61/785,613, filed on Mar. 14, 2013.

(51) Int. Cl.
*G11C 7/00* (2006.01)
(52) U.S. Cl.
CPC .......................................... *G11C 7/00* (2013.01)
USPC ..................... 365/191; 365/189.05
(58) Field of Classification Search
USPC ................................. 365/191, 189.05, 189.11
See application file for complete search history.

(56) References Cited

U.S. PATENT DOCUMENTS

| 8,476,931 | B2 | 7/2013 | Matsuoka |
| 2008/0054981 | A1 | 3/2008 | Hosoe et al. |
| 2009/0003086 | A1* | 1/2009 | Yun .......................... 365/189.05 |
| 2009/0201046 | A1* | 8/2009 | Pan et al. ......................... 326/29 |
| 2011/0102073 | A1 | 5/2011 | Riho |
| 2012/0099364 | A1 | 4/2012 | Park et al. |

FOREIGN PATENT DOCUMENTS

| JP | 2007-150991 A | 6/2007 |
| JP | 2009-022029 A | 1/2009 |
| JP | 2011-041209 A | 2/2011 |

* cited by examiner

*Primary Examiner* — Huan Hoang
(74) *Attorney, Agent, or Firm* — Holtz, Holtz, Goodman & Chick PC

(57) ABSTRACT

According to one embodiment, during a transition to and from a state assumed while a signal is being received from outside a memory device at the terminal, a first pre-driver outputs a first signal which transitions at a lower rate than that during a transition to and from a state assumed while a signal is being output to outside the memory device at the terminal. During a transition to and from a state assumed while a signal is being received from outside the memory device at the terminal, a second pre-driver outputs a second signal which transitions at a lower rate than that during a transition to and from a state assumed while a signal is being output to outside the memory device at the terminal.

16 Claims, 9 Drawing Sheets

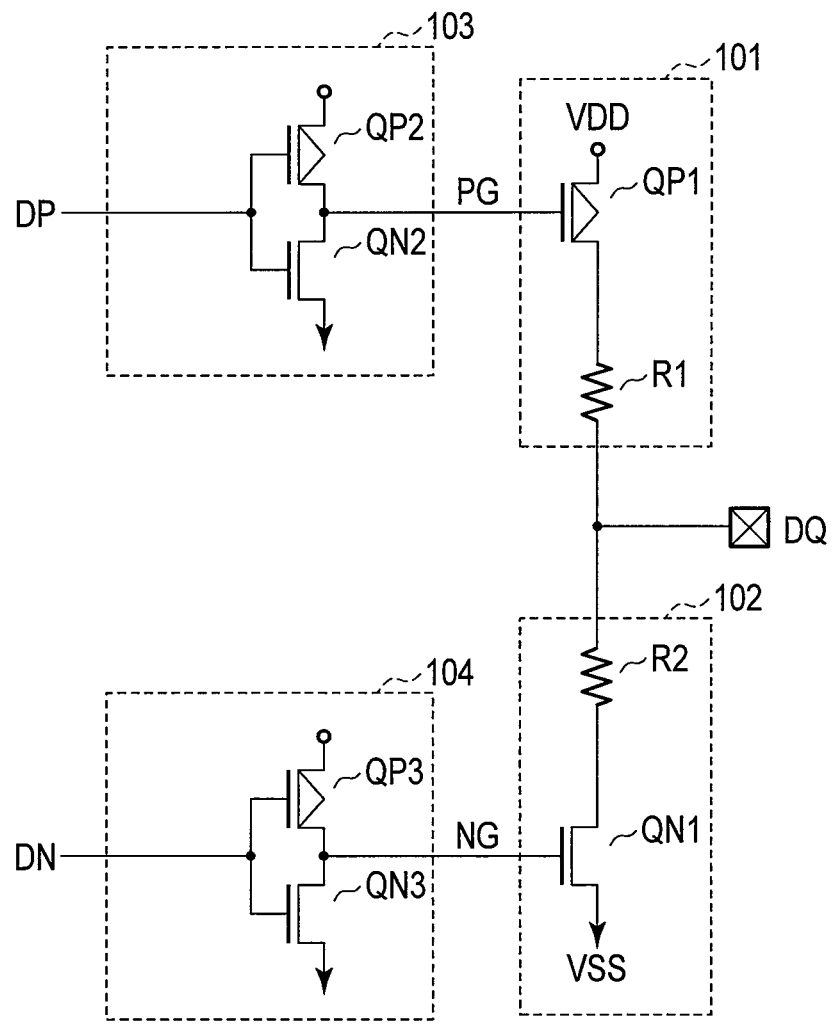
F I G. 1

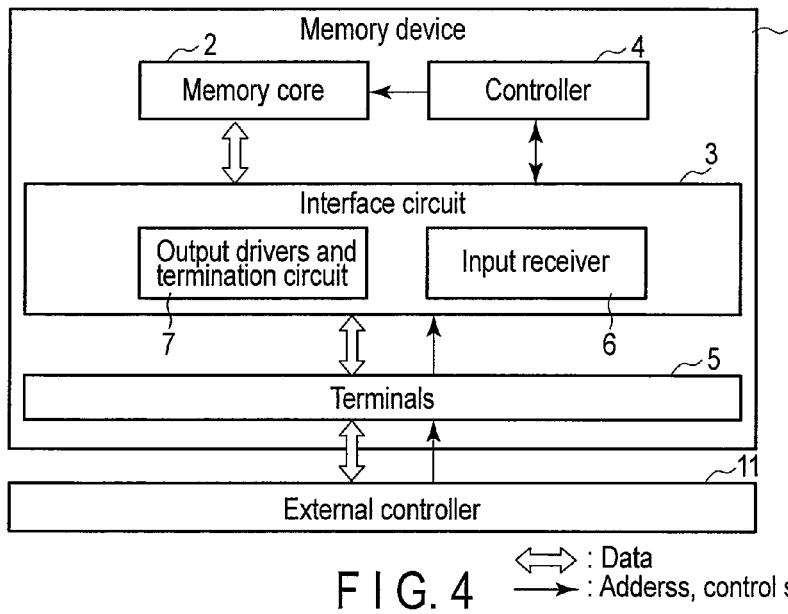
F I G. 4    ⇔ : Data
→ : Adderss, control signal
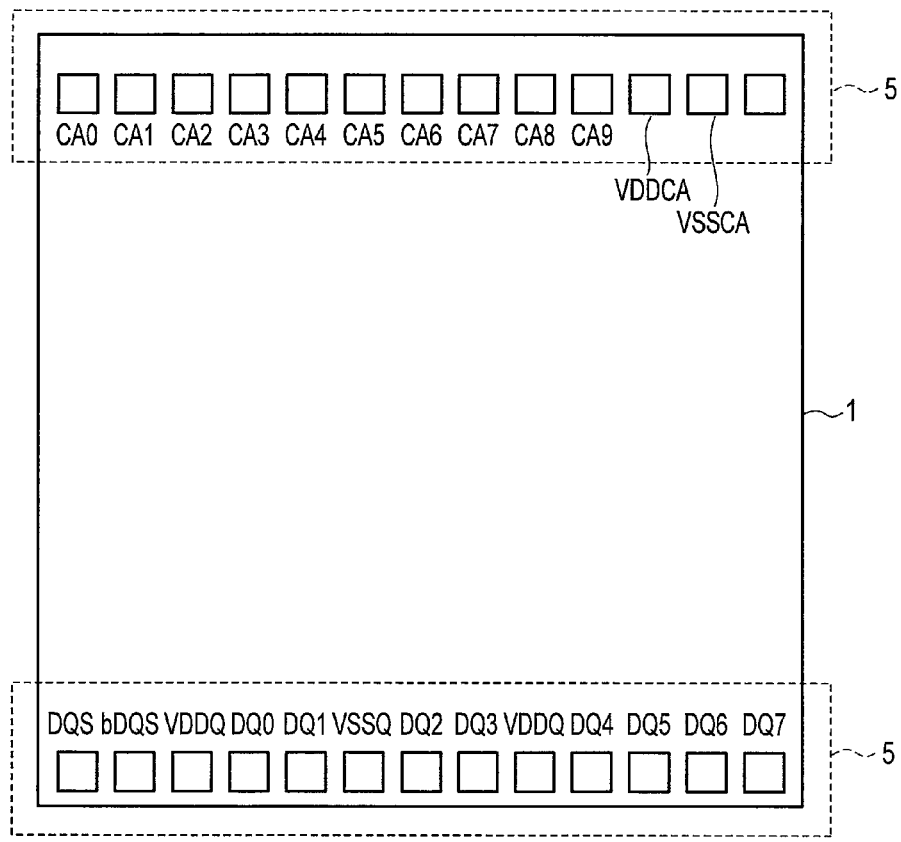
F I G. 5

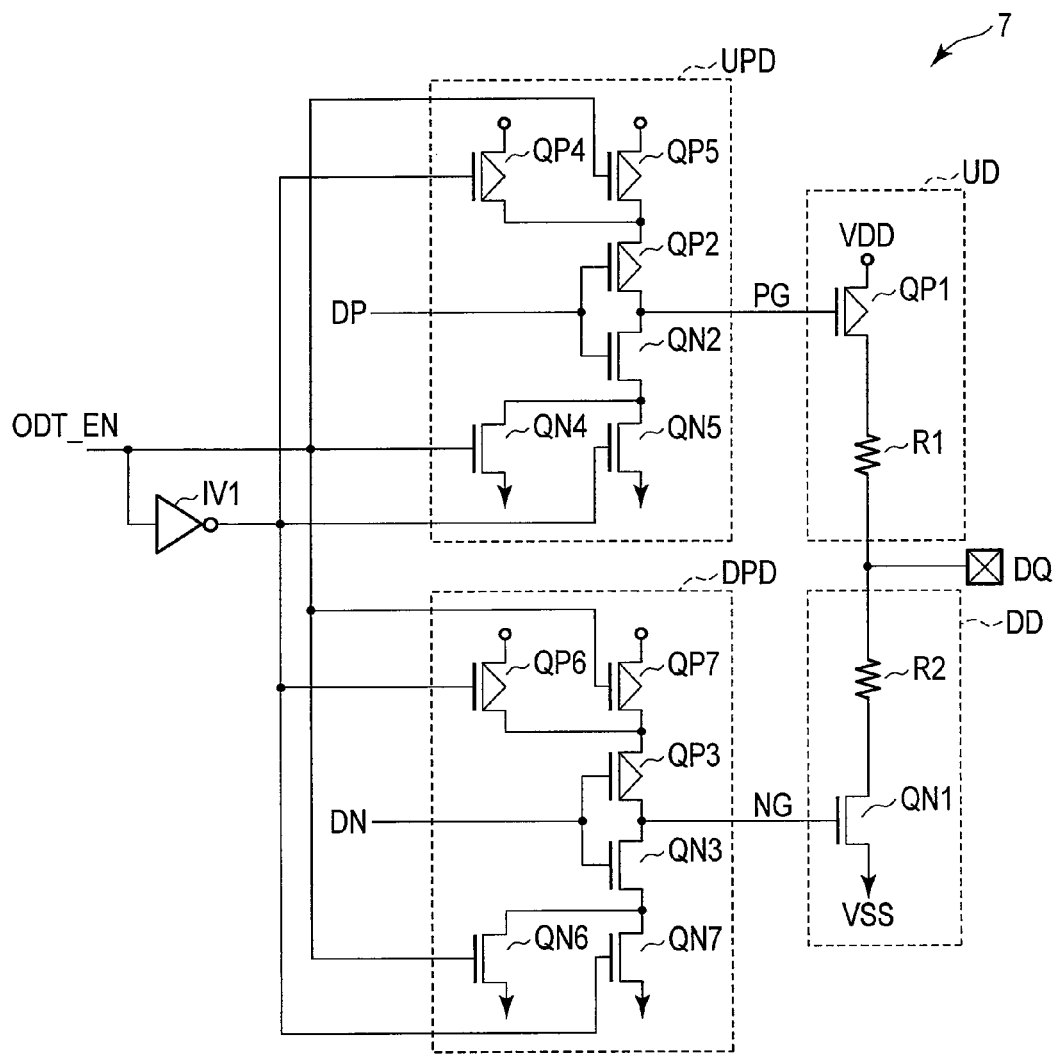
F I G. 6

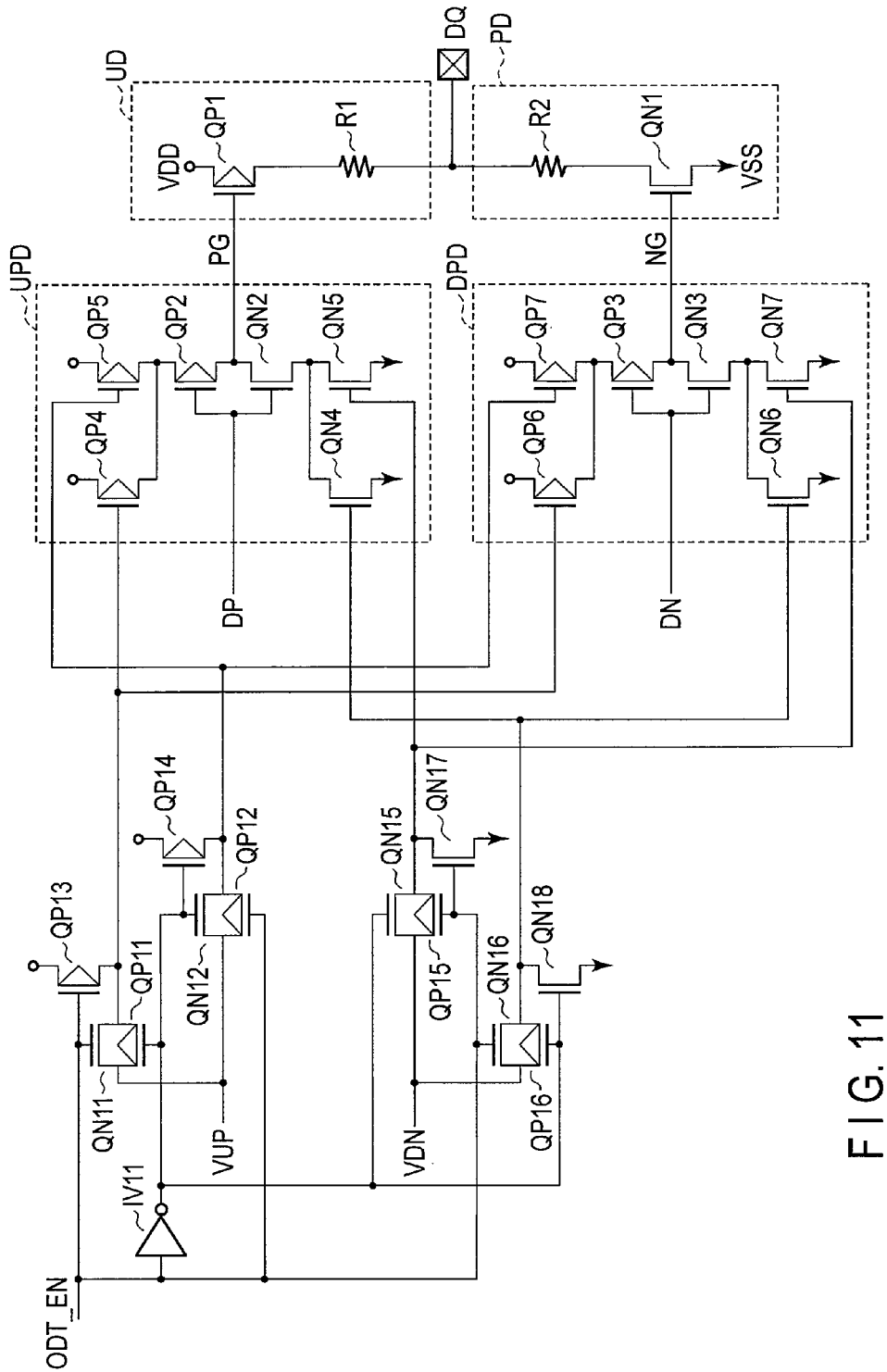
F I G. 11

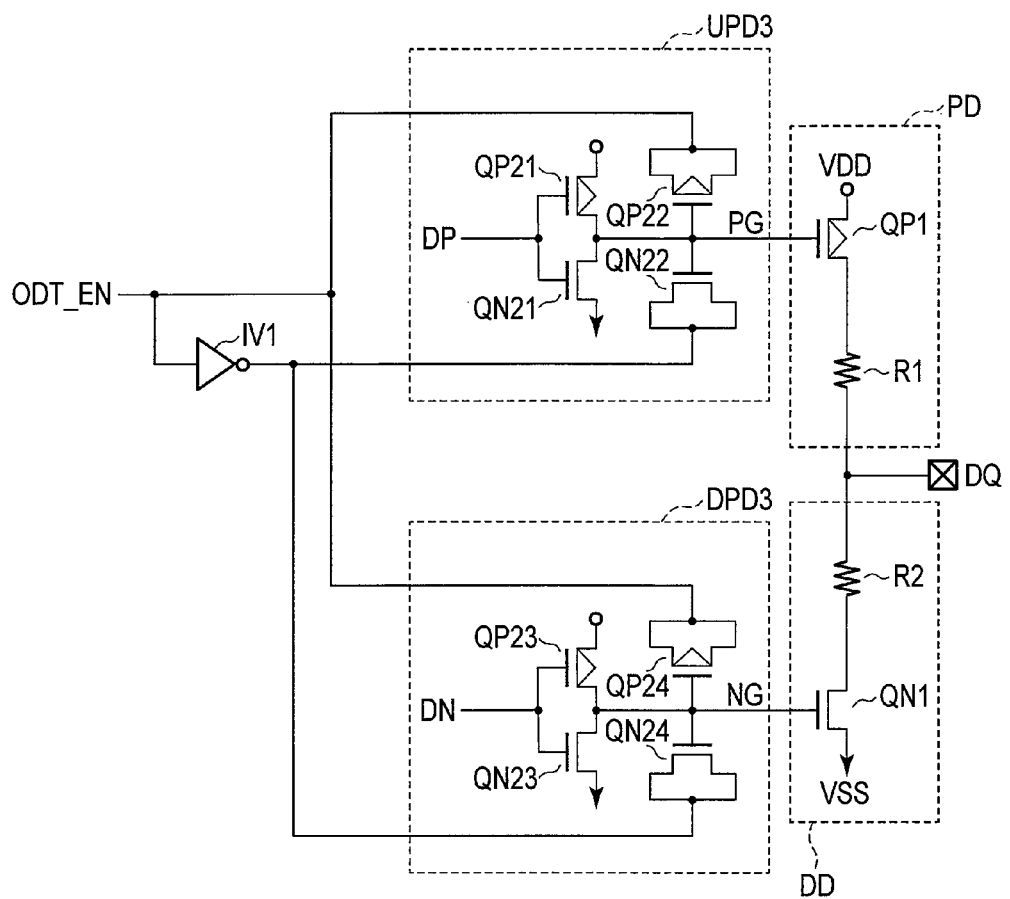
F I G. 13

MEMORY DEVICE

CROSS-REFERENCE TO RELATED APPLICATIONS

This application claims the benefit of U.S. Provisional Application No. 61/785,613, filed Mar. 14, 2013, the entire contents of which are incorporated herein by reference.

FIELD

Embodiments described herein relate generally to memory devices.

BACKGROUND

There are demands for high-speed operation of memory devices. For high-speed operation, it is known to reduce the voltage swing of signals on a data bus to be smaller than that between the power supply and ground, and to use bus termination to prevent reflection of the signals.

BRIEF DESCRIPTION OF THE DRAWINGS

FIG. 1 illustrates an example configuration for ODT.
FIG. 4 is a block diagram of a storage device of a first embodiment.
FIG. 5 illustrates an example exterior of the memory device of the first embodiment when seen from above.
FIG. 6 is a circuit diagram of part of an output driver and termination circuit of the first embodiment.
FIG. 11 is a circuit diagram of part of the output driver and termination circuit of a second embodiment.
FIG. 13 is a circuit diagram of a part of the output driver and termination circuit of a fourth embodiment.

DETAILED DESCRIPTION

Figure 2:
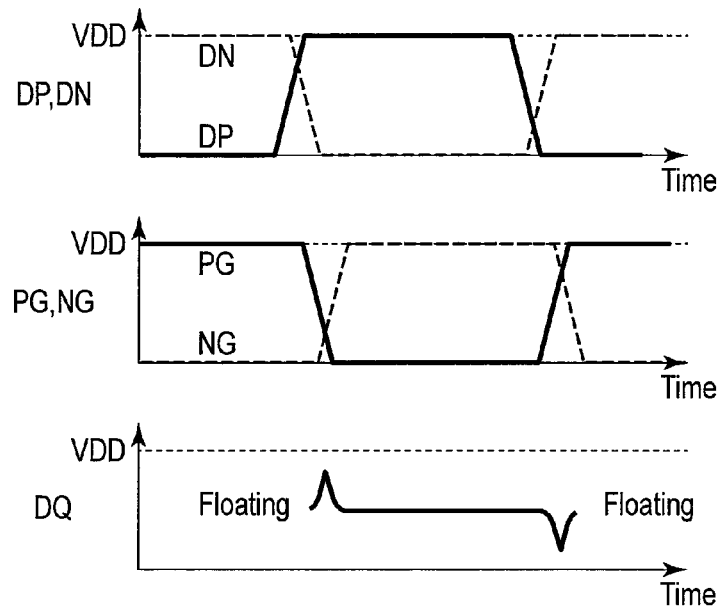
FIG. 2 illustrates signal waves during termination.

In general, according to one embodiment, a memory device comprises memory cells, a first driver coupled to a terminal and driven by a first signal, a second driver coupled to the terminal and driven by a second signal, a first pre-driver and a second pre-driver. The first pre-driver receives a third signal based on data from the memory cells while a signal is being output to outside the memory device at the terminal, outputs the first signal in accordance with the third signal, and, during a transition to and from a state assumed while a signal is being received from outside the memory device at the terminal, outputs the first signal which transitions at a lower rate than that during a transition to and from a state assumed while a signal is being output to outside the memory device at the terminal. The second pre-driver receives a fourth signal based on data from the memory cells while a signal is being output to outside the memory device at the terminal, outputs the second signal in accordance with the fourth signal, and, during a transition to and from a state assumed while a signal is being received from outside the memory device at the terminal, outputs the second signal which transitions at a lower rate than that during a transition to and from a state assumed while a signal is being output to outside the memory device at the terminal.

In order to reduce the voltage swing of a signal on a data bus to be smaller than that between the power supply and the ground as well as to prevent the signal from reflecting, the data bus may be coupled to a termination voltage with a resistor to terminate the data bus. This resistor may be provided inside a memory device chip, and such termination within a chip may be referred to as on-die termination (ODT).

FIG. 1 illustrates an example configuration for the ODT. The ODT may be implemented with part of an output driver. FIG. 1 illustrates part of an output driver of a memory device, and illustrates components associated with one of data input and output terminals coupled to a data bus. As shown in FIG. 1, a data input and output terminal DQ is coupled to a pull-up driver 101 and a pull-down driver 102. The driver 101 includes a transistor QP1 and a resistance element R1 coupled in series between the power supply VDD and the terminal DQ. The transistor QP1 receives a signal PG from a pull-up pre-driver 103. The driver 103 includes transistors QP2 and QN2 coupled in series between the power supply VDD and the ground VSS. The transistors QP2 and QN2 receive a signal DP at their respective gates. The connection node between the transistors QP2 and QN2 outputs the signal PG.

The pull-down driver 102 includes a resistance element R2 and a transistor QN1 coupled in series between the terminal DQ and the ground VSS. The transistor QN1 receives a signal NG from a pull-down pre-driver 104. The driver 104 includes transistors QP3 and QN3 coupled in series between the power supply VDD and the ground VSS. The transistors QP3 and QN3 receive a signal DN at their respective gates. The connection node between the transistors QP3 and QN3 outputs the signal NG.

When the memory device outputs data from the terminal DQ, the transistor QP1 or QN1 is alternatively turned on. In contrast, when a signal is input to the terminal DQ from outside the memory device, both transistors QP1 and QN1 are turned on. This terminates the terminal DQ to a potential somewhere between the power supply potential and the ground in accordance with the impedances of the drivers 101 and 102. Generally, the impedance of the driver 101 is set equal to that of impedance of the driver 102 to result in the terminal potential at an intermediate level between the power supply potential and the ground. This reduces the voltage swing of the signal input to the terminal DQ from outside the memory device to be smaller than it would be without the termination. The thus reduced signal voltage swing can reduce the capacitance of the terminal DQ to charge and discharge upon transition of the data signal on the terminal DQ to allow for high-speed operation. It also achieves the impedance mismatch smaller than it would be without the termination of terminal DQ, i.e., than that with a case where the drivers 101 and 102 are off to make the terminal DQ in a high impedance state, which results in suppression of signal reflection.

Figure 3:
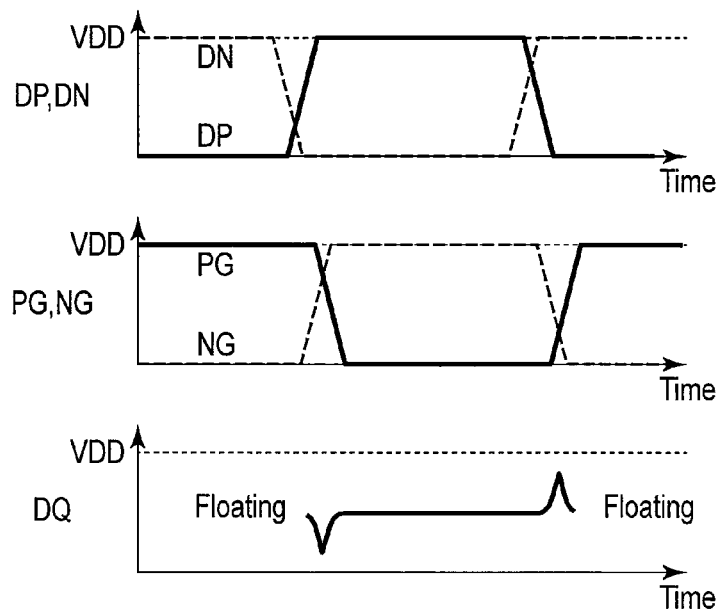
FIG. 3 illustrates other signal waves during termination.

The use of part of the output driver in FIG. 1 for the ODT may cause the following phenomena. In order to terminate the terminal DQ, the transistors QP1 and QN1 are turned on as described above. The following phenomena do not occur if transistors QP1 and QN1 are turned on completely simultaneously. They, however, cannot be usually turned on completely simultaneously, and therefore one of them is turned on earlier or later than the other as shown in FIGS. 2 and 3. FIG. 2 shows an example with the earlier timing of transistor QP1 (pull-up), whereas FIG. 3 shows an example with earlier timing of transistor QN1 (pull-down). FIGS. 2 and 3 illustrate voltage waveforms of the signals DP, DN, PG and NG and terminal DQ upon termination of the terminal DQ. The transition of the signal DP to the high level earlier or later than that of the signal DN to the low level makes the gate nodes PG and NG of transistors QP1 and QN1 transition at different timings. This in turn results in only the earlier-turned-on one of the transistors driving the terminal DQ, and therefore a glitch occurs on the voltage of the terminal DQ. When this glitch exceeds a threshold voltage of an input circuit (of the memory device) coupled to the terminal DQ, erroneous data may be input, depending on the timing for enable of the input circuit.

As described above, the glitch occurs due to one of the transistors QP1 and QN1 turning on earlier to drive the terminal DQ, and therefore the shorter the times for transistors QP1 and QN1 to transition to ON, i.e., the higher the transition rates of the voltages of the gate nodes PG and NG, the larger the glitch. The transition rates of the voltages of the gate nodes PG and NG may be reduced to control the glitch. The slew rate of an output wave is, however, desirably large when the memory device outputs data from the terminal DQ, which requires large transition rates of the voltages of the gate nodes PG and NG. As such, the ODT and data output operations require conflicting requirements for the nodes PG and NG, which is problematic. The description has covered the ODT-on operation; however the same is applicable to the ODT-off operation.

Embodiments configured based on such findings will now be described with reference to the drawings. Components with substantially the same function and configuration will be referred to with the same reference numbers and repetitive descriptions will be given only when required. Note that figures are merely schematic. Moreover, each embodiment is used to only illustrate a device and/or method to implement a technical idea of this embodiment.

Each functional block may be implemented as hardware, computer software, or a combination of both. In order to clearly illustrate this interchangeability of hardware and software, descriptions will be made in terms of their functionality in general. Furthermore, it is not essential that the functional blocks are distinguished from one another as described below in specific examples. For example, some of the functions may be implemented by functional blocks different from those illustrated below. Moreover, an illustrated functional block may be divided into functional sub-blocks.

First Embodiment

FIG. 4 is a block diagram of a memory device according to the first embodiment. As shown in FIG. 4, the memory device 1 includes a memory core 2, an interface circuit 3, a controller 4, and terminals 5. The memory device 1 is configured to store data with any known technique. Specifically, the memory device 1 may be a magnetoresistive random access memory (MRAM), a dynamic random access memory (DRAM), or a flash memory. The first embodiment is not limited by the data storage system of the memory device 1.

The memory core 2 is configured to store data, and includes components such as memory cells. The memory core 2 has components, connections and arrangements in accordance with the data storage system of the storage device 1. Specifically, for a case of the memory device 1 being the MRAM, the memory core 2 is configured to use the magnetoresistance effect to store data in the memory cells. Memory cells of the MRAM are configured to exhibit the magnetoresistance effect, and store data in a non-volatile manner in accordance with the state of magnetization.

For a case of the memory device 1 being the DRAM, the memory core 2 is configured to use charge storage in the memory cells to store data. Memory cells of the DRAM include capacitors, and store data in a volatile manner in accordance with the electric charge stored by the capacitors.

For a case of the storage device 1 being the flash memory, the memory core 2 is configured to use charge storage in the memory cells to store data. Memory cells of the flash memory store data in a non-volatile manner in accordance with the amount of the electric charge trapped in insulators or in floating gate electrodes.

The memory core 2 is also configured to write (or input) and read (or output) data to and from memory cells specified by received address and control signals.

The interface circuit 3 is an interface between the memory device 1 and an external controller 11. The interface circuit 3 includes an input receiver circuit 6, and an output driver and termination circuit 7. The input receiver circuit 6, and the output driver and termination circuit 7 are coupled to the terminals 5. The terminals 5 are coupled to the external controller 11 via a bus, a control signal line, etc. The terminals 5 include at least one, or typically multiple data input and output terminals. The terminals 5 also include address control signal input terminals and power supply terminals.

The input receiver circuit 6 receives signals such as data from the external controller 11 via the bus and data input and output terminals, and outputs them to the memory core 2. The output driver and termination circuit 3 receives signals such as data from the memory core 2, and outputs them to the external controller 11 via the bus and data input and output terminals. The output driver and termination circuit 3 are also configured to terminate the data input and output terminals during a particular period. The output driver and termination circuit 3 will be described in full detail later.

The controller 4 receives control signals such as an address and a command from the external controller 11 via the control signal line, a control signal input terminal, and an input receiver circuit for the controller 4 in the interface circuit 3. The controller 4 controls the memory core 2 and interface circuit 3 in accordance with the received control signals. The controller 4 and interface circuit 3 receive potentials such as power and ground (or common) potentials via power supply terminals.

FIG. 5 illustrates an example exterior of the memory device 1 of the first embodiment when seen from above. In particular, FIG. 5 schematically and conceptually illustrates the terminals 5, and does not show them in scale or arrangement thereof. As shown in FIG. 5, provided along, for example, the lower edge of the chip are terminals such as terminals DQS, bDQS, VDDQ, DQ0, DQ1, VSSQ, DQ2, DQ3, VDDQ and so on. Also provided along its upper edge are terminals such as terminals CA0 to CA9, VDDCA and VSSCA. The sign "b" at the head of a reference number refers to the inverted logic thereof.

Each of the terminals DQ0 to DQ7 corresponds to the above data input and output terminal, and receives or outputs an individual data signal. The terminal DQS and bDQS receive respective strobe signals during data inputs at the terminals DQ0 to DQ7, and output respective strobe signals during data outputs along with output data from the terminals DQ0 to DQ7. The terminals VDDQ and VSSQ correspond to the above power supply terminals, and receive the power supply and the ground potential to be supplied to data input receiver and output driver circuits, respectively. The terminals CA0 to CA9 correspond to the above address control signal input terminals, and receive signals such as a command signal and an address signal. The terminals VDDCA and VSSCA correspond to the above power supply terminals, and receive the power supply and the ground potential to be supplied to control signal input receiver circuits. The reason why sets of the power supply and ground potential for data input receiver and output driver circuits and control signal input receiver circuits are provided is, for example, to stabilize potentials. The terminals VDDQ and VDDCA receive essentially the same power potential VDD, and terminals VSSQ and VSSCA receive essentially the same ground potential VSS.

The terminals 5 only need to include at least one data input and output terminal as described above. The positions of the data input and output terminals and additional data input and output terminals, and whether a further terminal is provided and its position are arbitrary. FIG. 5 only illustrates an example thereof.

FIG. 6 is part of a circuit diagram of the output driver and termination circuit 7 according to the first embodiment. FIG. 6 illustrates components associated with one of the data input and output terminals DQ0 to DQ7 (DQ). The output driver and termination circuit 7 has components and connection as shown in FIG. 6 for at least one data input and output terminal DQ, and typically for each of all data input and output terminals DQ0 to DQ7 and the terminal DQS and bDQS.

As shown in FIG. 6, the circuit 7 includes a pull-up driver UD and a pull-down driver DD. The driver UD includes a p-type metal oxide semiconductor field effect transistor (MOSFET) QP1 and a resistance element R1, which are coupled in series between the power supply VDD and terminal DQ. The transistor QP1 receives a signal PG at its gate.

The driver DD includes a resistance element R2 and an n-type MOSFET QN1, which are coupled in series between the terminal DQ and ground VSS. The transistor QN1 receives a signal NG at its gate.

The circuit 7 also includes a pull-up pre-driver UPD and a pull-down pre-driver DPD. The pre-driver UPD includes a p-type MOSFET QP2 and an n-type MOSFET QN2, which are coupled in series. The connection node of the transistors QP2 and QN2 supplies the transistor QP1 with the signal PG at its gate. The transistors QP2 and QN2 receive a signal DP at their gates. The signal DP is supplied from, for example, another circuit in the interface circuit 3. The pre-driver UPD also includes p-type MOSFETs QP4 and QP5 and n-type MOSFETs QN4 and QN5. The transistor QP5 has a size (i.e., the gate width) or current driving capability larger than that of the transistor QP4. The transistor QN5 has a size or current driving capability larger than that of the transistor QN4. The transistors QP4 and QP5 are coupled in parallel between the power supply VDD and the source of the transistor QP2. The transistors QN4 and QN5 are coupled in parallel between the source of the transistor QN2 and the ground VSS. The transistors QN4 and QP5 receive an ODT enable signal ODT_EN at their gates. In contrast, the transistors QP4 and QN5 receive the logically-inverted signal of the ODT enable signal ODT_EN from the inverter IV1 at their gates. The inverter IV1 receives the ODT enable signal ODT_EN, and outputs the inversion thereof.

The pull-down pre-driver DPD includes a p-type MOSFET QP3 and an n-type MOSFET QN3, which are coupled in series. The connection node of the transistors QP3 and QN3 supplies the transistor QN1 with a signal NG at its gate. The transistors QP3 and QN3 receive a signal DN at their gates. The signal DN is supplied from, for example another circuit in the interface circuit 3. The pre-driver DPD also includes p-type MOSFETs QP6 and QP7 and n-type MOSFETs QN6 and QN7. The transistor QP7 has a size or current driving capability larger than that of the transistor QP6. The transistor QN7 has a size or current driving capability larger than that of the transistor QN6. The transistors QP6 and QP7 are coupled in parallel between the power supply VDD and the source of transistor QP3. The transistors QN6 and QN7 are coupled in parallel between the source of the transistor QN3 and the ground VSS. The transistors QN6 and QP7 receive the ODT enable signal ODT_EN at their gates. In contrast, the transistors QP6 and QN7 receive the logically-inverted signal of the ODT enable signal from the inverter IV1 at their gates.

The signal ODT_EN remains low-level during a time other than execution of the ODT, or at least during data outputs. While the signal ODT_EN remains low-level, the transistors QP4, QN4, QP6 and QN6 are off, whereas the transistors QP5, QN5, QP7 and QN7 on. In contrast, the signal ODT_EN is made high during the execution of the ODT, or at least before the ODT as preparation for the ODT. While the signal ODT_EN remains high, the transistors QP5, QN5, QP7 and QN7 are off, whereas the transistors QP4, QN4, QP6 and QN6 are on.

Figure 7:
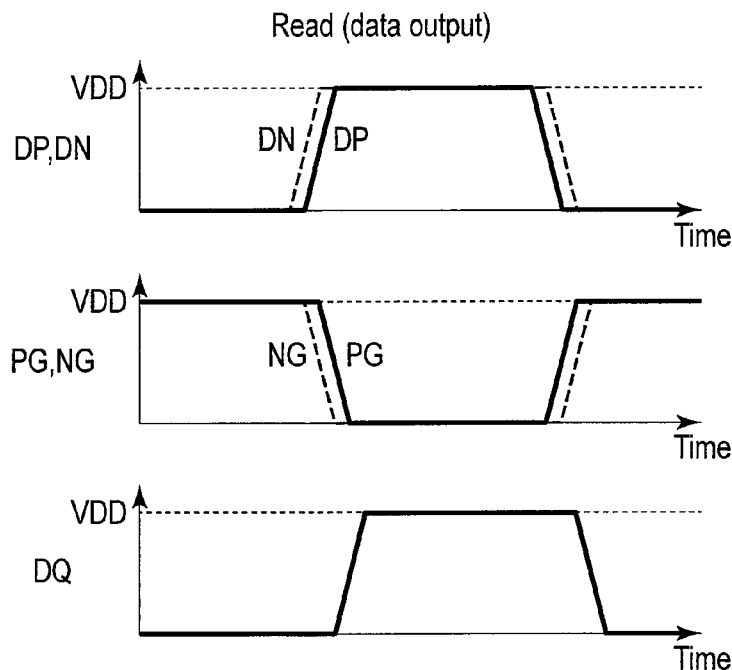
FIG. 7 illustrates signal waves of the output driver and termination circuit of the first embodiment during data output.

FIG. 7 shows signal waves during a data output (data read) by the output driver and termination circuit 7 of the first embodiment. During data outputs, the signals DP and DN are made to have logics to turn on one of the transistor QP1 and QN1 in accordance with the polarity of data which will be output from the data input and output terminal DQ. Specifically, both they are made high or low. Low-level signals DP and DN make the signals PG and NG high. High-level signals PG and NG make the potential on the terminal DQ (or signal DQ) low.

In contrast, high-level signals DP and DN make both the signals PG and NG low. Low-level signals PG and NG make the signal DQ on the terminal DQ high.

The reason why the signals DP and DN transition at different timings is to prevent a penetration current flowing through the transistors QP1 and QN1 and the resistance element R1 and R2. The timings may be, however, simultaneous if such penetration current induces no malfunction. The sizes of transistors QP5, QN5, QP7 and QN7 are determined so that the slew rates of the signals PG and NG have desired levels during data outputs.

Figure 8:
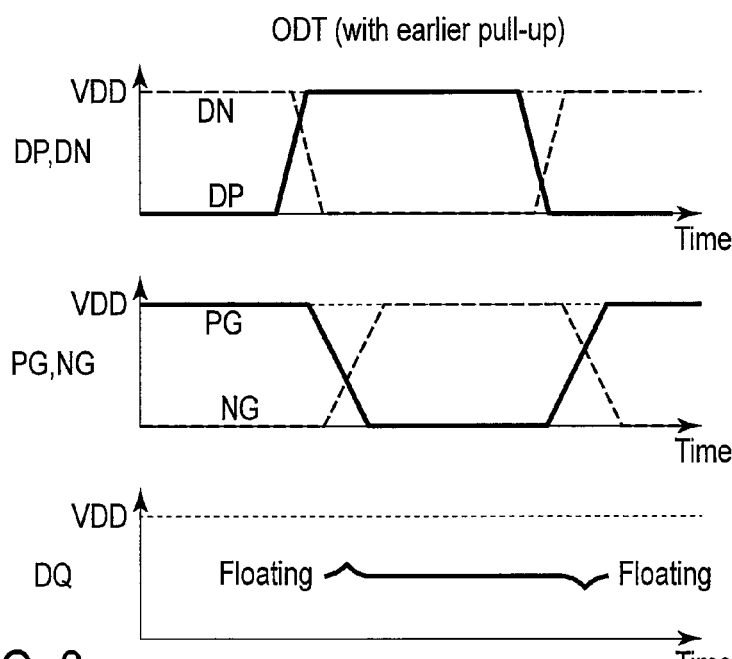
FIG. 8 illustrates signal wave forms of the output driver and termination circuit of the first embodiment during ODT execution.
Figure 9:
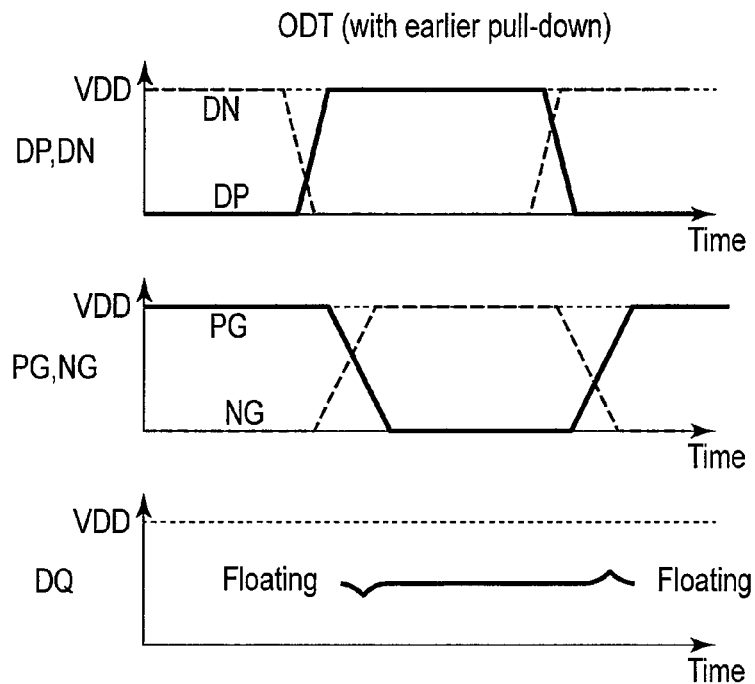
FIG. 9 illustrates other signal wave forms of the output driver and termination circuit of the first embodiment during the ODT execution.

FIGS. 8 and 9 show waves of signals of the output driver and termination circuit 7 of the first embodiment during execution of the ODT. FIG. 8 shows a case with a signal DP transition earlier than a signal DN transition, and FIG. 9 a case with the signal DN transition earlier than the signal DP transition. As described and shown in FIGS. 8 and 9, prior to the ODT operation, the signal ODT_EN is made high.

During times other than data outputs, the signals DP and DN have logics to keep the transistors QP1 and QN1 off (low and high levels, respectively). During these times, the terminal DQ is in a Hi-Z (high impedance) state. During the ODT execution, the signals DP and DN are controlled independently of a signal DATA, which transmits the polarity of output data to the signals DP and DN. This control is executed with, for example, the signal ODT_EN in the interface circuitry 3. The signals DP and DN are then made to have logics to turn on both transistors QP1 and QN1 (high and low levels, respectively) to terminate the terminal DQ.

As described above, during, before and after the ODT operation execution, the transistors QP5, QN5, QP7 and QN7 are off, whereas the transistors QP4, QN4, QP6 and QN6 are on. The transistors QP4, QN4, QP6 and QN6 have current drivabilities smaller than those of the transistors QP5, QN5, QP7 and QN7, respectively. For this reason, respective sources of the transistors QP2 (during the ODT OFF transitions) and QP3 (during the ODT ON transitions) are pulled to the power supply potential VDD more slowly than during the data output operations, and respective sources of the transistor QN2 (during the ODT ON transitions) and QN3 (during ODT OFF transitions) are pulled to the ground VSS more slowly than during the data output operations. Therefore, the slew rates of the signals PG and NG at the start and/or end of an ODT operation are smaller than those at the start and/or end of a data output operation. As a result, even with a difference in the transition timings of the signals PG and NG, during the ODT ON transitions, the transistor with the earlier on-transition drives the terminal DQ until the other transistor is turned on with less current than would be with the slew rates of the signals PG and NG equal to those during the data outputs. During the ODT OFF transitions, the earlier-off-transitioning transistor decreases its driving current more slowly, and therefore the other transistor alone drives the terminal DQ more shortly. This results in a reduced glitch on the terminal DQ. The sizes of the transistors QP4, QN4, QP6 and QN6 are determined to allow the slew rates of the signals PG and NG to have desired levels at the starts and ends of the execution of ODT operations. At the end of the ODT operation, both the signals DN and DP are returned to logics to turn off the transistors QP1 and QN1, and the signal ODT_EN is made low.

The signal ODT_EN is supplied, for example, from the controller 4. Specifically, the external controller 11 instructs the controller 4 to shift to the ODT prior to a write operation, for example. Then, the controller 4 supplies the circuit 3 or 7 with a high-level signal ODT_EN. Alternatively, the signal ODT_EN may be supplied directly from the external controller 11. For example, in a DRAM, it is supplied directly from the external controller 11. The signal ODT_EN can be supplied by any method.

Figure 10:
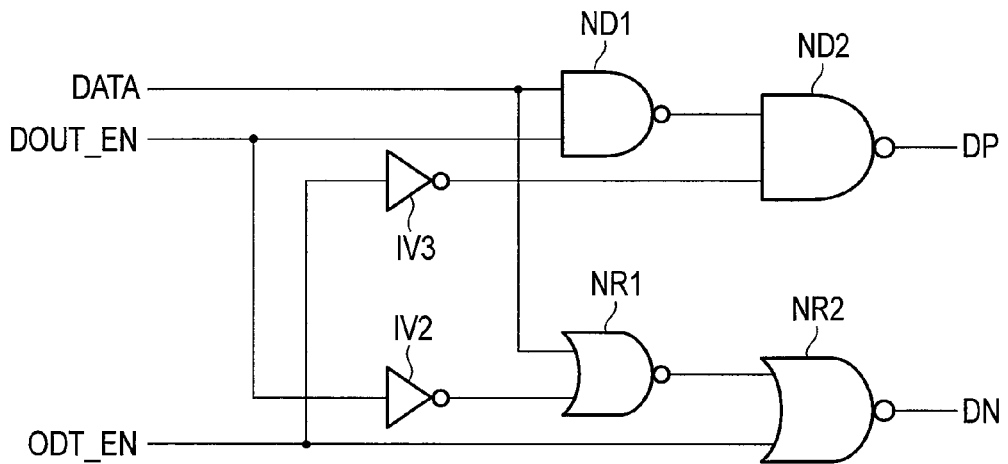
FIG. 10 illustrates an example circuit to output signals DP and DN of the first embodiment.

The signals DN and DP may be generated from, for example, the data signal DATA from the memory core 2, signals ODT_EN and DOUT_EN. FIG. 10 illustrates an example of a circuit to output the signals DP and DN of the first embodiment and is part of the interface circuit 3, for example. As shown in FIG. 10, the data signal DATA and signal DOUT_EN are supplied to a NAND gate ND1. The signal DATA transitions between high and low in accordance with data which should be output from the terminal DQ. The signal DATA is transferred from the memory core 2. The data signal DATA is also supplied to a NOR gate NR1, and the signal DOUT_EN is also supplied to the NOR gate NR1 through an inverter IV2.

The output of the NAND gate ND1 is supplied to a NAND gate ND2, which also receives the signal ODT_EN through an inverter IV3. The NAND gate ND2 outputs the signal DP. The output of the NOR gate NR1 is supplied to a NOR gate NR2, which also receives the signal ODT_EN. The NOR gate NR2 outputs the signal DN.

With the FIG. 10 circuit, the signals DP and DN are made high and low while the signal ODT_EN is high, respectively, regardless of the polarities of the signals DATA and DOUT_EN. In contrast, while the signal ODT_EN is low and the signal DOUT_EN is high, the signals DP and DN have the same polarity as the signal DATA. While both the signals DOUT_EN and ODT_EN are low, the signals DP and DN are low and high, respectively, and, therefore, the terminal DQ is in the Hi-Z state.

The description so far has been made of an example where the set of the transistors QP4, QN4, QP6 and QN6 and the set of the transistors QP5, QN5, QP7 and QN7 are alternatively turned on during the ODT operations and data output operations, respectively. The circuit 7, however, may be controlled so that only the set of the transistors QP4, QN4, QP6 and QN6 are turned on during the execution of the ODT, and both sets are turned on during data outputs. To this end, the transistors QP4 to QP7 and QN4 to QN7 receive at their gates respective control signals of logics which turn on these transistors during data output operations. Furthermore, the transistor QP5, QN5, QP7 and QN7 receive at their gates respective control signals of logics which turn off these transistors during execution of ODT, for example. To this end, a logic circuit to receive a control signal and the ODT enable signal ODT_EN is configured to invert the control signals at the gates of the transistors QP4, QN4, QP6 and QN6 while the signal ODT_EN is high, respectively. In this example, the sizes of the transistors QP4 to QP7 and QN4 to QN7 are determined to generate the signals PG and NG with high slew rates during the data outputs and those with low slew rates during the ODT execution. Specifically, the transistors QP4, QN4, QP6 and QN6 have sizes to implement required slew rates of the signals PG and NG during the ODT execution. Then, the transistors QP5, QN5, QP7 and QN7 have sizes to allow the transistors QP4 to QP7 and QN4 to QN7 to implement required slew rates of the signals PG and NG during the data outputs.

As described above, according to the first embodiment, the pre-drivers UPD and DPD are configured to have respective current drivabilities during the execution of ODT smaller than those during the data outputs. This results in the signals PG and NG to drive the drivers UD and PD having slew rates at the start and end of the execution of the ODT smaller than those during data outputs. This reduces the glitch on the terminal DQ at the start and end of the ODT to be smaller than would be with the same slew rates of the currents PG and NG at the start and end of the ODT and data outputs. This in turn can avoid erroneous input of data at the start and end of the ODT, and therefore malfunction of the memory device 1. Moreover, these advantages do not sacrifice a signal quality at the terminal DQ during the data outputs because the slew rates of the drive currents PG and NG remain large during the data outputs.

Second Embodiment

FIG. 11 is a diagram of part of the output driver and termination circuit 7 according to the second embodiment. FIG. 11 illustrates components associated with one of the data input and output terminals DQ0 to DQ7, DQS and bDQS (DQ) as in FIG. 6. In the second embodiment, unlike the first embodiment where the transistors QP4 to QP7 and QN4 to QN7 receive digital signals of level of voltage VDD or VSS, they receive analog signals of voltage levels somewhere between the voltage VDD and VSS at their gates.

As shown in FIG. 11, the ODT enable signal ODT_EN is supplied to the gate of an n-type MOSFET QN11. The enable signal ODT_EN is also supplied to the gate of a p-type MOSFET QP11 via an inverter IV11. The transistors QN11 and QP11 are coupled in parallel, one of the two connection nodes of the transistors QN11 and QP11 receives an analog signal VUP and the other is coupled to respective gates of the transistors QP4 and QP6. The respective gates of the transistor QP4 and QP6 are also coupled to the power supply VDD via a p-type MOSFET QP13. The transistor QP13 receives the signal ODT_EN at its gate.

The ODT enable signal ODT_EN is also supplied to the gate of a p-type MOSFET QP12. The output of the inverter IV11 (logically-inverted signal of the signal ODT_EN) is supplied to the gate of an n-type MOSFET QN12. The transistors QN12 and QP12 are coupled in parallel, one of the two connection nodes of the transistors QN12 and QP12 receives the analog signal VUP and the other is coupled to respective gates of the transistors QP5 and QP7. The respective gates of the transistor QP5 and QP7 are also coupled to the power supply VDD via a p-type MOSFET QP14. The transistor QP14 receives the output of the inverter IV11 at its gate.

The ODT enable signal ODT_EN is also supplied to the gate of a p-type MOSFET QP15. The output of the inverter IV11 is also supplied to the gate of an n-type MOSFET QN15. The transistors QN15 and QP15 are coupled in parallel, one of the two connection nodes of the transistors QN15 and QP15 receives an analog signal VDN, and the other is coupled to respective gates of the transistors QN5 and QN7. The respective gates of the transistors QN5 and QN7 are also grounded via an n-type MOSFET QN17. The transistor QN17 receives the signal ODT_EN at its gate.

The ODT enable signal ODT_EN is also supplied to the gate of an n-type MOSFET QN16. The output of the inverter IV11 is also supplied to the gate of a p-type MOSFET QP16. The transistors QN16 and QP16 are coupled in parallel, one of the two connection nodes of the transistors QN16 and QP16 receives the analog signal VDN, and the other is coupled to the respective gates of the transistors QN4 and QN6. The respective gates of the transistors QN4 and QN6 are also grounded via an n-type MOSFET QN18. The transistor QN18 receives the output of the inverter IV11 at its gate.

During the data outputs, the enable signal ODT_EN is low. The low-level signal ODT_EN fixes the gates of the transistors QP4 and QP6 to the power supply potential via the transistor QP13, and grounds the gates of the transistor QN4 and QN6 via the transistor QN18. As a result, the transistors QP4, QN4, QP6 and QN6 remain off. The low-level signal ODT_EN also transfers the analog signal VUP to the gates of the transistors QP5 and QP7, and the analog signal VDN to the gates of the transistors QN5 and QN7. The analog signals VUP and VDN are controlled to have potentials to allow p-type and n-type MOSFETs which receive the signals at their gates to flow a constant current per unit gate width, respectively, and they vary in accordance with variation in conditions such as process condition of transistors in the memory device 1, the temperature of the environment where the memory device 1 is used, and potentials supplied to the memory device 1 such as VDD and VSS. This results in almost constant current drivabilities of the transistors QP5, QN5, QP7 and QN7 which receive the analog signal VUP or VDN at their gates over these condition variations, respectively. This in turn substantially results in almost constant current drivabilities of the transistors QP2 and QN2 and those of the transistors QP3 and QN3 during the data outputs over the above condition variations, respectively. This then results in almost constant behaviors of PG and NG during data outputs over the condition variations, respectively.

In contrast, the enable signal ODT_EN is high during the ODT operation. The high-level signal ODT_EN fixes the respective gates of the transistors QP5 and QP7 to the power supply potential via the transistor QP14, and grounds the respective gates of the transistors QN5 and QN7 via the transistor QN17. As a result, the transistors QP5, QN5, QP7 and QN7 remain off. The high-level signal ODT_EN also transfers the analog signal VUP to the gates of the transistors QP4 and QP6, and the analog signal VDN to the gates of the transistors QN4 and QN6. The gate widths of the transistors QP4 and QN4 are smaller than those of the transistors QP5 and QN5 respectively, and therefore the current to drive the node PG during the ODT execution is smaller than that during the data output operations. Similarly, the gate widths of the transistors QP6 and QN6 are smaller than those of the transistors QN7 and QN7 respectively, and therefore the current to drive the node NG during the ODT execution is smaller than that during the data outputs. As a result, the current through the transistors QP2 and QN2 and that through the transistors QP3 and QN3 during the ODT execution are smaller than those during the data outputs, and almost constant over the above condition variations. This in turn results in almost constant behaviors of the signals PG and NG during the ODT operation execution over the condition variations. The description for the first embodiment is also applicable to the second embodiment other than those described for the second embodiment.

As described above, according to the second embodiment, the pre-drivers UPD and DPD are configured to have current drivabilities during the ODT execution smaller than those during the data outputs as in the first embodiment. This can produce the same advantages as those of the first embodiment. Moreover, according to the second embodiment, the transistors QP4 to QP7 and QN4 to QN7 receive the analog signals VUP or VDN at their gates. The analog signals VUP and VDN vary in accordance with conditions of the memory device 1. This results in almost constant behaviors of the signals PG and NG over the above conditions during the data outputs as well as during the ODT execution, respectively. Therefore, the memory device 1 which behaves substantially uniformly can be implemented.

Third Embodiment

Figure 12:
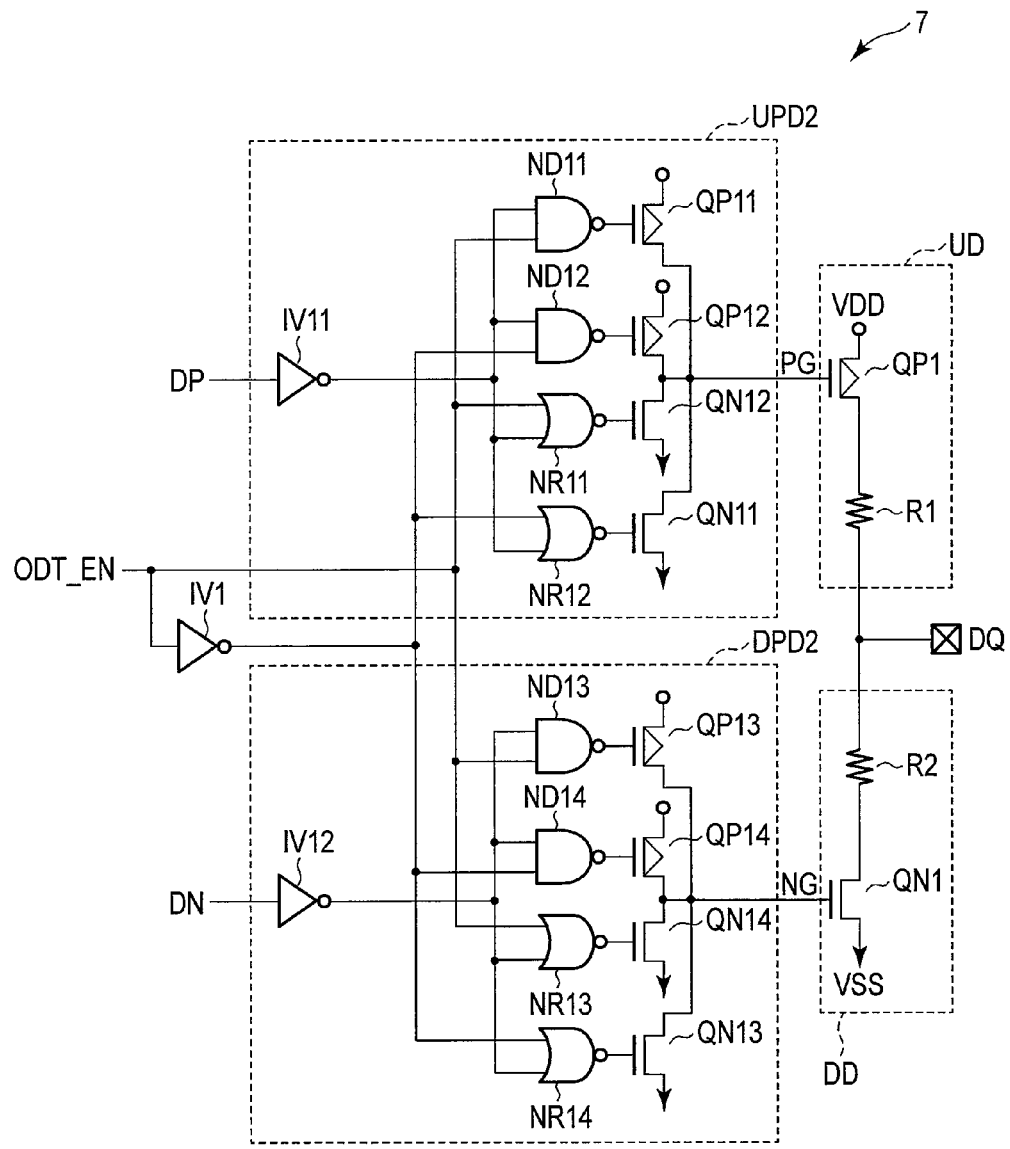
FIG. 12 is a circuit diagram of part of the output driver and termination circuit of a third embodiment.

FIG. 12 is a diagram of part of the output driver and termination circuit 7 according to the third embodiment. FIG. 12 illustrates components associated with one of the data input and output terminals DQ0 to DQ7, DQS, and bDQS (DQ) as in FIG. 6. As shown in FIG. 12, the circuit 7 in the third embodiment includes a pull-up pre-driver UPD2 and a pull-down pre-driver DPD2 instead of the pull-up pre-driver UPD and pull-down pre-driver DPD which have components and connections as shown in FIG. 6.

The driver UPD2 includes NAND gates ND11 and ND12, NOR gates NR11 and NR12, an inverter IV11, p-type MOSFETs QP11 and QP12, and n-type MOSFETs QN11 and QN12. The transistor QP12 has a size or current drivability larger than that of the transistor QP11. The transistor QN12 has a size or current drivability larger than that of the transistor QN11. The signal ODT_EN is supplied to the NAND gate ND11 and NOR gate NR11. The output of the inverter IV1 is supplied to the NAND gate ND12 and NOR gate NR12. The signal DP is supplied to the inverter IV11, and the output of the inverter IV11 is supplied to the NAND gates ND11 and ND12 and NOR gates NR11 and NR12. The outputs of the NAND gates ND11 and ND12 and NOR gates NR11 and NR12 are supplied to the respective gates of the transistor QP11, QP12, QN12 and QN11, respectively. The transistors QP11 and QN11 are coupled in series between the power supply VDD and the ground VSS. The connection node of the transistors QP11 and QN11 supplies the gate of the transistor QP1 with the signal PG. The transistors QP12 and QN12 are coupled in series between the power supply VDD and the ground VSS. The connection node of the transistors QP12 and QN12 is coupled to the gate of the transistor QP1.

The driver DPD2 includes NAND gates ND13 and ND14, NOR gates NR13 and NR14, an inverter IV12, p-type MOSFETs QP13 and QP14, and n-type MOSFETs QN13 and QN14. The transistor QP14 has a size or current drivability larger than that of the transistor QP13. The transistor QN14 has a size or current drivability larger than that of the transistor QN13. The signal ODT_EN is supplied to the NAND gate ND13 and NOR gate NR13. The output of the inverter IV1 is supplied to the NAND gate ND14 and NOR gate NR14. The signal DN is supplied to the inverter IV12, and the output of the inverter IV12 is supplied to the NAND gates ND13 and ND14 and NOR gates NR13 and NR14. The outputs of the NAND gates ND13 and ND14 and NOR gates NR13 and NR14 are supplied to the respective gates of the transistors QP13, QP14, QN14 and QN13, respectively. The transistors QP13 and QN13 are coupled in series between the power supply VDD and the ground VSS. The connection node of the transistors QP13 and QN13 supplies the gate of the transistor QN1 with the signal NG. The transistors QP14 and QN14 are coupled in series between the power supply VDD and the ground VSS. The connection node of transistors QP14 and QN14 is coupled to the gate of the transistor QN1.

The sizes of the transistor QP12, QN12, QP14 and QN14 are determined to allow the slew rate of the signals PG and NG to have desired levels during the data outputs. The sizes of the transistors QP11, QN11, QP13 and QN13 are determined to allow the slew rates of the signals PG and NG to have desired levels at the start and end of the ODT execution.

Also, with the components and connections shown in FIG. 12, the pre-drivers UPD2 and DPD2 have current drivabilities during the ODT execution smaller than those during the data outputs as the pre-drivers UPD and DPD as in the first embodiment. Specifically, while the signal ODT_EN remains low, the transistors QP11, QN11, QP13 and QN13 are off, whereas the transistor QP12, QN12, QP14 and QN14 are on. In contrast, while the signal ODT_EN remains high, the transistor QP12, QN12, QP14 and QN14 are off, whereas the transistor QP11, QN11, QP13 and QN13 are on in accordance with the signals DP and DN. Therefore, the slew rates of the signals PG and NG at the start and/or end of the execution of the ODT operation are smaller than those at the data output operations as in the first embodiment.

The description so far has been made of an example where the set of the transistors QP11, QN11, QP13 and QN13 and the set of the transistors QP12, QN12, QP14 and QN14 are alternatively turned on during the ODT operations and data output operations, respectively. The circuit 7, however, may be controlled so that only the set of the transistors QP11, QN11, QP13 and QN13 are turned on during execution of the ODT, and both sets are turned on in accordance with the signals DP and DN during the data outputs. For example, during the data output operation, the NAND gates ND11 to ND14 receive the high level and NOR gates NR11 to NR14 receive the low level instead of the ODT enable signal ODT_EN or the logical inversion thereof. Furthermore, in order to turn off the transistors QP12, QN12, QP14 and QN14 during the ODT execution, a control circuit is configured so that the NAND gates ND12 and ND14 receive the low level and NOR gates NR11 and NR13 receive the high level instead of the ODT enable signal ODT_EN or the logical inversion thereof. In this example, the sizes of the transistors QP11 to QP14 and QN11 to QN14 are determined to generate the signals PG and NG with higher slew rates during the data outputs and those with lower slew rates during the ODT execution. Specifically, the transistors QP11, QN11, QP13 and QN13 have sizes to implement required slew rates of the signals PG and NG during the ODT execution. Then, the transistors QP12, QN12, QP14 and QN14 have sizes to allow the transistors QP11 to QP14 and QN11 to QN14 to implement required slew rates of the signals PG and NG during the data outputs.

As described above, according to the third embodiment, the pre-drivers UPD2 and DPD2 are configured to have current drivabilities during the execution of ODT operation smaller than those during data output, as in the first embodiment. This can produce the same advantages as those of the first embodiment.

Fourth Embodiment

FIG. 13 is a diagram of part of the output driver and termination circuit 7 according to the fourth embodiment. FIG. 13 illustrates components associated with one of the data input and output terminals DQ0 to DQ7, DQS, and the bDQS (DQ) as in FIG. 6. As shown in FIG. 13, the circuit 7 in the fourth embodiment includes a pull-up pre-driver UPD3 and a pull-down pre-driver DPD3 instead of the pull-up pre-driver UPD and pull-down pre-driver DPD which have components and connections as shown in FIG. 6.

The driver UPD3 includes p-type MOSFETs QP21 and QP22, and n-type MOSFETs QN21 and QN22. The transistors QP21 and QN21 are coupled in series between the power supply VDD and the ground VSS. The transistors QP21 and QN22 receive the signal DP at their gates. The connection node of the transistors QP21 and QN21 supplies the signal PG to the gate of the transistor QP1, and is coupled to the gates of the transistors QP22 and QN22. The both ends of the transistor QP22 receive the signal ODT_EN. The both ends of the transistor QN22 receive the output of the inverter IV1. In other words, the transistor QP22 is formed as a MOS capacitor between the signal PG and signal ODT_EN. The transistor QN22 is formed as a MOS capacitor between the signal PG and the output of the inverter IV1 (logically-inverted signal of the signal ODT_EN). With the signal ODT_EN high, the source and drain of the transistor QP22 are high. This turns on the MOS capacity of the transistor QP22 when the signal PG is low, and therefore it serves as a load capacitor when the signal PG is charged to high from low (upon the ends of the ODT operations), which can reduce the slew rate of the signal PG. In contrast, with the signal ODT_EN high, the source and drain of the transistor QN22 are low. This turns on the MOS capacitor of the transistor QN22 when the signal PG is high, and therefore it serves as a load capacity when the signal PG is discharged to low from high (upon the start of the ODT operations), which can reduce the slew rate of the signal PG.

The driver DPD3 includes p-type MOSFETs QP23 and QP24, and n-type MOSFETs QN23 and QN24. The transistors QP23 and QN23 are coupled in series between the power supply VDD and the ground VSS. The transistors QP23 and QN23 receive the signal DN at their gates. The connection node of the transistors QP23 and QN23 supplies the signal NG to the gate of the transistor QN1, and is coupled to the gates of the transistors QP24 and QN24. The both ends of the transistor QP24 receive the signal ODT_EN. The both ends of the transistor QN24 receive the output of the inverter IV1. In other words, the transistor QP24 is formed as a MOS capacitor between the signal NG and signal ODT_EN. The transistor QN24 is formed as a MOS capacitor between the signal NG and the output of the inverter IV1 (logically-inverted signal of the signal ODT_EN). With the signal ODT_EN high, the source and drain of the transistor QP24 are high. This turns on the MOS capacitor of the transistor QP24 when the signal NG is low, and therefore it serves as a load capacitor when the signal NG is charged to high from low (upon the start of the ODT operation), which can reduce the slew rate of the signal NG. In contrast, with the signal ODT_EN high, the source and drain of the transistor QN24 are low. This turns on the MOS capacitor of the transistor QN24 when the signal NG is high, and therefore it serves as a load capacitor when the signal NG is discharged to low from high (upon the ends of the ODT operations), which can reduce the slew rate of the signal NG.

The sizes of the transistor QP22, QN22, QP24 and QN24 are determined so that they have the load capacitances which reduce the slew rates of the signals PG and NG to desired levels at the start and end of ODT execution.

With the components and connections shown in FIG. 13, the pre-drivers UPD3 and DPD3 have the same current drivabilities during the ODT execution as in the data outputs as with the conventional pre-drivers 103 and 104 in FIG. 1; however they have increased load capacitances of the nodes PG and NG to drive. Specifically, with the signal ODT_EN low, the transistors QP22 and QN22 do not serve as a load capacity to the node PG, and transistors QP24 and QN24 do not serve as a load capacitor to the node NG. In contrast, with the signal ODT_EN high, the transistors QP22 and QN22 appear as a load capacitor to the node PG, and the transistors QP24 and QN24 appear as a load capacitor to the node NG. Therefore, the slew rates of the signals PG and NG at the starts and/or ends of the ODT operations are smaller than those at the starts and/or ends of the data output operations, as in the first embodiment.

As described above, according to the fourth embodiment, the pre-drivers UPD3 and DPD3 are configured to generate a larger load capacitor on a node to drive during the ODT operations than that during the data outputs. Therefore, the slew rates of the signals PG and NG at the start and/or end of the ODT operations are smaller than those during the data outputs as in the first embodiment. This can produce the same advantages as those of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   memory cells,
   a first driver coupled to a terminal and driven by a first signal;
   a second driver coupled to the terminal and driven by a second signal;
   a first pre-driver which
      receives a third signal based on data from the memory cells while a signal is being output to outside the memory device at the terminal,
      outputs the first signal in accordance with the third signal, and
      during a transition to and from a state assumed while a signal is being received from outside the memory device at the terminal, outputs the first signal which transitions at a lower rate than that during a transition to and from a state assumed while a signal is being output to outside the memory device at the terminal; and
   a second pre-driver which
      receives a fourth signal based on data from the memory cells while a signal is being output to outside the memory device at the terminal,
      outputs the second signal in accordance with the fourth signal, and
      during a transition to and from a state assumed while a signal is being received from outside the memory device at the terminal, outputs the second signal which transitions at a lower rate than that during a transition to and from a state assumed while a signal is being output to outside the memory device at the terminal.

2. The device of claim 1, wherein:
   the first pre-driver is configured to pull the first signal to one of a power supply potential and the ground at a variable speed; and
   the second pre-driver is configured to pull the second signal to the power supply potential and the ground at a variable speed.

3. The device of claim 2, wherein:
   the first pre-driver comprises a first transistor and a second transistor coupled in series;
   a node between the first and second transistors outputs the first signal;
   the first pre-driver is configured to pull at least one of the first and second transistors to the power supply potential or ground at a variable speed,
   the second pre-driver comprises a third transistor and a fourth transistor coupled in series;
   a node between the third and fourth transistors outputs the second signal; and
   the second pre-driver is configured to pull at least one of the third and fourth transistors to the power supply potential or ground at a variable speed.

4. The device of claim 3, wherein:
   the first pre-driver comprises fifth transistors coupled in parallel to a first end of the serially-coupled first and second transistors;
   the second pre-driver comprises sixth transistors coupled in parallel to a first end of the serially-coupled third and fourth transistors;
   all or a first subset of the fifth transistors are on while a signal is being output to outside the memory device at the terminal, the first subset comprising one or more of the fifth transistors;
   a second subset of the fifth transistors are on while a signal is being received from outside the memory device at the terminal, the second subset comprising one or more of the fifth transistors;
   the second subset of the fifth transistors is different from the first subset of the fifth transistors, and has a current drivability smaller than that of the first subset of the fifth transistors;
   all or a first subset of the sixth transistors are on while a signal is being output to outside the memory device at the terminal, the first subset comprising one or more of the sixth transistors;
   a second subset of the sixth transistors are on while a signal is being received from outside the memory device at the terminal, the second subset comprising one or more of the sixth transistors;
   the second subset of the sixth transistors is different from the first subset of the sixth transistors, and has a current drivability smaller than that of the first subset of the sixth transistors.

5. The device of claim 4, wherein:
   the first and second pre-drivers receive an enable signal while a signal is being received from outside the memory device at the terminal; and the fifth and sixth transistors are turned on or off in accordance with the enable signal.

6. The device of claim 4, wherein the fifth and sixth transistors receive analog signals at gates.

7. The device of claim 4, wherein:
the first pre-driver further comprises seventh transistors coupled in parallel to a second end of the serially-coupled first and second transistors;
the second pre-driver further comprises eighth transistors coupled in parallel to a second end of the serially-coupled third and fourth transistors;
all or a first subset of the seventh transistors are on in accordance with the polarity of data which will be output while a signal is being output to outside the memory device at the terminal, the first subset comprising one or more of the seventh transistors;
a second subset of the seventh transistors are on while a signal is being received from outside the memory device at the terminal, the second subset comprising one or more of the seventh transistors;
the second subset of the seventh transistors is different from the first subset of the seventh transistors, and has a current drivability smaller than that of the first subset of the seventh transistors;
all or a first subset of the eighth transistors are on while a signal is being output to outside the memory device at the terminal, the first subset comprising one or more of the eighth transistors;
a second subset of the eighth transistors are on while a signal is being received from outside the memory device at the terminal, the second subset comprising one or more of the eighth transistors; and
the second subset of the eighth transistors is different from the first subset of the eighth transistors, and has a current drivability smaller than that of the first subset of the eighth transistors.

8. The device of claim 7, wherein:
the first and second pre-drivers receive an enable signal while a signal is being received from outside the memory device at the terminal; and
the fifth, sixth, seventh and eighth transistors are turned on or off in accordance with the enable signal.

9. The device of claim 7, wherein:
the fifth transistors are coupled between the first transistor and a power supply potential;
the sixth transistors are coupled between the third transistor and a power supply potential;
the seventh transistors are coupled between the second transistor and the ground; and
the eighth transistors are coupled between the fourth transistor and the ground.

10. The device of claim 7, wherein the fifth, sixth, seventh and eighth transistors receive analog signals at gates.

11. The device of claim 2, wherein:
the first pre-driver comprises first transistor pairs;
each of the first transistor pairs comprises serially-coupled transistors, and a connection node between the serially-coupled transistors;
the connection node of each of the first transistor pairs is a node to output the first signal;
all or a first subset of the first transistor pairs output the first signal while a signal is being output to outside the memory device at the terminal, the first subset comprising one or more of the first transistor pairs;
a second subset of the first transistor pairs outputs the first signal while a signal is being received from outside the memory device at the terminal, the second subset comprising one or more of the first transistor pairs;
the second subset of the first transistor pairs is different from the first subset of the first transistor pairs, and has a current drivability smaller than that of the first subset of the first transistor pairs;
the second pre-driver comprises second transistor pairs;
each of the second transistor pairs comprises serially-coupled transistors, and a connection node between the serially-coupled transistors;
the connection node of each of the second transistor pairs is a node to output the second signal;
all or a first subset of the second transistor pairs output the second signal while a signal is being output to outside the memory device at the terminal, the first subset comprising one or more of the second transistor pairs;
a second subset of the second transistor pairs outputs the second signal while a signal is being received from outside the memory device at the terminal, the second subset comprising one or more of the second transistors; and
the second subset of the second transistor pairs is different from the first subset of the second transistor pairs, and has a current drivability smaller than that of the first subset of the second transistor pairs.

12. The device of claim 11, wherein:
the first and second pre-drivers receive an enable signal while a signal is received from outside the memory device at the terminal;
whether the first signal is output by all or the first subset of the first transistor pairs, or by the second subset of the first transistor pairs is selected in accordance with the enable signal; and
whether the second signal is output by all or the first subset of the second transistor pairs, or by the second subset of the second transistor pairs is selected in accordance with the enable signal.

13. The device of claim 2, wherein:
the first pre-driver comprises a first transistor and a second transistor coupled in series;
the second pre-driver comprises a third transistor and a fourth transistor coupled in series; and
the first and second pre-drivers are configured to:
increase a load capacitance of a first node which outputs the first signal and a second node which outputs the second signal while a signal is being received from outside the memory device at the terminal and;
decrease the load capacitance while a signal is not being received from outside the memory device at the terminal.

14. The device of claim 13, wherein:
the first pre-driver further comprises a fifth transistor and a sixth transistor;
the fifth transistor has both ends coupled and has a gate coupled to the first node;
the sixth transistor has both ends coupled and has a gate coupled to the first node;
the second pre-driver further comprises a seventh transistor and an eighth transistor;
the seventh transistor has both ends coupled and has a gate coupled to the second node; and
the eighth transistor has both ends coupled, and has a gate coupled to the second node.

15. The device of claim 14, wherein:
the first and second pre-drivers receive an enable signal while a signal is being received from outside the memory device at the terminal;

the both ends of the fifth transistor and the both ends of the seventh transistor receive the enable signal; and the both ends of the sixth transistor and the both ends of the eighth transistor receive an inversion of the enable signal.

16. The device of claim 1, wherein:

the third and fourth signals have logics to drive both the first and second drivers while the terminal is receiving a signal from outside the memory device.

* * * * *